United States Patent [19]

Ross et al.

[11] Patent Number: 4,578,321
[45] Date of Patent: Mar. 25, 1986

[54] ALTERING THE SWITCHING THRESHOLD OF A MAGNETIC MATERIAL

[75] Inventors: William E. Ross, Woodland Hills; Bruce E. MacNeal, Fullerton, both of Calif.

[73] Assignee: Litton Systems, Inc., Beverly Hills, Calif.

[21] Appl. No.: 503,404

[22] Filed: Jun. 13, 1983

Related U.S. Application Data

[62] Division of Ser. No. 320,819, Nov. 12, 1981.

[51] Int. Cl.[4] ............................................. H01F 10/02
[52] U.S. Cl. .................................... 428/693; 428/900
[58] Field of Search ............................... 428/693, 900

*Primary Examiner*—Bernard D. Pianalto

[57] ABSTRACT

A low-anisotropy magnetic material is exchange coupled in juxtaposition with a compatible body of high-anisotropy magnetic material so that a reduced external magnetic field is required for the nucleation and passage of a domain wall from the low-anisotropy material, through the interface between the low- and high-anisotropy materials, and into the high-anisotropy material. The propagation of the domain wall continues to affect a reversal in the direction of magnetization in the high-anisotropy material.

3 Claims, 2 Drawing Figures

ALTERING THE SWITCHING THRESHOLD OF A MAGNETIC MATERIAL

This application is a division of application Ser. No. 320,819, filed Nov. 12, 1981.

BACKGROUND ART

It is known that the direction of magnetization of a magnetic material can be reversed or switched by impressing an external magnetic field of opposite polarity on the material, however, the magnitude of such an external bias field must be relatively high to ensure not only the nucleation by coherent rotation of a domain wall, which separates adjacent regions of the material where each region has an opposite direction of magnetization, but also the propagation of the domain wall through the material until the desired reversal of magnetization direction is obtained. It is well known that in regions of material further from the source of the external field, an increased magnetic field is required to complete the desired propagation of the domain wall through the material. For example, see the following prior art teachings of reversal or switching the direction of magnetization by the use of an externally applied field: see Fast Switchable Magneto-Optic Memory-Display Components; U.S. Pat. Nos. 3,715,736 and 4,114,191. Another prior art teaching (British Pat. No. 1,180,334) uses both an external field and coincident current select of pixels or posts in a magneto-optic display.

A requirement continues for a relatively high external field to accomplish a desired reversal or switching of the direction of magnetization in magnetic materials that support magnetic domains. The nucleation, and the displacement or propagation of a magnetic domain wall in a magnetic material, such as garnets, requires an applied magnetic field. The applied field is generally to the magnetization of the magnetic material. In certain magnetic materials having a high anisotropy, the applied field required to change the direction of magnetization, i.e. magnetic switching, is relatively large; for example, certain films of magnetic material exhibit switching field values in excess of 16,000 Oersteds (Oe). However, it is also known that the switching field required to nucleate a magnetic reversal is relatively large in comparison to that required to displace or propagate the magnetic domain wall which results from the act of nucleating. It would be beneficial to change the magnetic properties of such a magnetic material to alter its switching threshold and, therefore, require an applied switching field of lower value; for example, less than 1000 Oe. This would be useful for a number of systems that use magnetic materials such as computer bubble memories and magneto-optic displays.

In a best mode of the invention, a high anisotropy magnetic material has the magnetic properties altered in a first region of the material so that the first region exhibits a relatively low anisotropy characteristic. The first region is exchange coupled to the remainder of the material at an interface that permits the displacement of a magnetic domain wall through the interface from the first region to the remainder of the material so that the direction of magnetization of the material can be changed or switched through an applied field having a relatively small value.

BRIEF DESCRIPTION OF THE DRAWINGS

The invention is described in detail below with reference to the drawings that include the illustration of one specific embodiment, in which.

BEST MODE OF CARRYING OUT THE INVENTION

Figure 1:
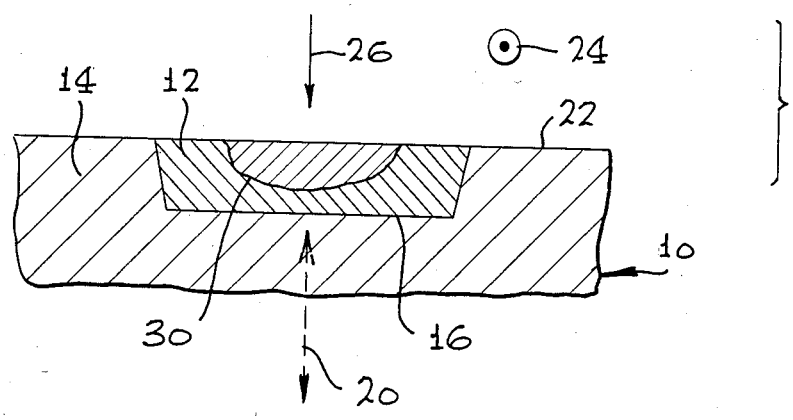
FIG. 1 is a sectional view, partly broken away, of a magnetic material that has been altered in accordance with the invention.

IN FIG. 1, a magnetic material 10 has a first region 12 of the material that is exchange coupled with a second region 14 of the material at an interface 16. In accordance with the present invention, the first region 12 exhibits low anisotropy when compared to the high anisotropy of the second region 14. The magnetic material 10 has an easy axis of magnetization 20 (shown in phantom by FIG. 1) that is in the plane of the drawing, i.e., perpendicular to the generally planar surface 22 of the magnetic material.

The anisotropy energy $K_\mu$ of the magnetic material in the first region 12 can be reduced by ion-implantation to a selected value, measured in ergs/cm, by suitable choices of species, dosage, and energy level at the time of implantation. In the example shown, the anisotropy is of the uniaxial type, but it is contemplated that this invention can be applicable to materials with different anisotropy characteristics, e.g., tri-axial, etc. It is also contemplated that other methods can be used to establish the desired low anisotropy region juxtaposed with a region of magnetic material which exhibits a high anisotropy characteristic. For example, a layer of magnetic material having a low anisotropy characteristic could be grown epitaxially on the mass of a magnetic material having a high anisotropy characteristic.

Laser annealing could also be used to reduce the high anisotropy characteristic of the mass of magnetic material by affecting a relatively thin surface layer or region. The use of an ion-implanted region, the first region 12, in the mass of magnetic material 10 is the best mode preferred at this time for carrying out the invention.

The reduced anisotropy energy $K_\mu$ of the first region 12 correspondingly reduces the external field $H_k$ required to reverse or switch the direction of magnetization of the magnetic material in the first region. A source 24 of an applied magnetic field, whose direction is represented by magnetic field arrow 26, is required at a value at least equal to the equivalent uniaxial anisotropy field, $H_k = 2K/Ms$, to switch the direction of magnetization along the easy axis 20, e.g., from the phantom arrow directed toward the planar surface 22 to the solid arrow directed away from the planar surface. Here, Ms is the size of the magnetization in FIG. 1, the magnetic field 26 is generaly parallel with the easy axis 20 and perpendicular to the planar surface 22. It is contemplated that the orientation of the magnetic field 26 can be at some angle away from the perpendicular so that the magnetic field is not parallel with the easy axis 20 but rather lateral to it.

When the magnetic field 26 is impressed upon the magnetic material 10, switching begins with the reversal of the direction of magnetization within the first region 12 since $K_\mu$ and thereby $H_k$ have been reduced in the magnetic material of the first region by implantation. As a result, a 180° domain wall 30 is formed which separates regions of the magnetic material that exhibit opposite directions of magnetization. Since the domain wall 30 is moved or propagated through the magnetic material 10 after nucleation, it is understood that its schematic representation in FIG. 1 is only for purposes of illustration and a clearer understanding of the invention.

Continued application of the magnetic field 26 propagates the domain wall through the first region 12, the interface 16, and into and through the second region 14 so that, in the preferred best mode, the direction of magnetization of the magnetic material 10 is reversed or switched.

Although the domain wall 30 is propagated by the continued application of the magnetic field 26 having a value at least equal to the anisotropy field $H_k$ of the first region 12, the interface 16 produces a gradient in the $H_k$, $\nabla H_k$, which results in a force that tends to trap the wall within the first region. Where $\nabla H_k$ is relatively small, a magnetic field large enough to reverse the direction of magnetization is also large enough to push the domain wall 30 through the interface 16. Where $\nabla H_k$ is large, the trapping force is larger so that the magnetic field required to reverse the direction of magnetization is less than the field required to push the domain wall through the interface 16 into the second region 14, Thus, even though $K_\mu$ can be made equal to or less than zero, the switching threshold approaches a constant value that corresponds to the magnetic field 26 required to overcome the gradient in $\nabla H_k$ at the interface 16 and drive the domain wall 30 into the second region 14.

Figure 2:
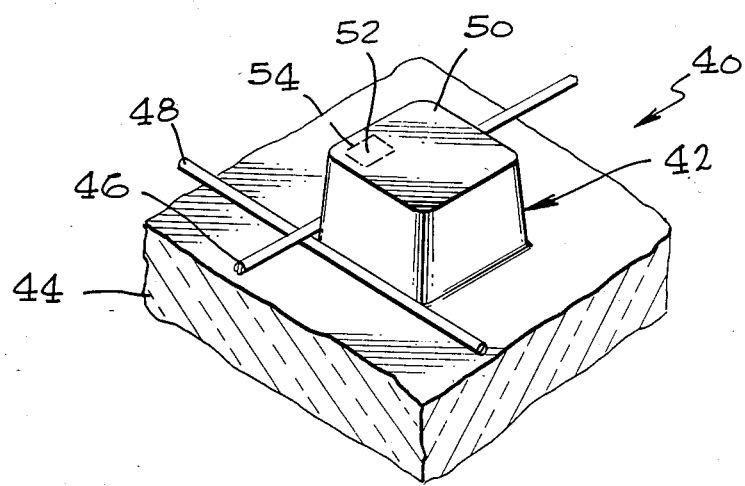
FIG. 2 is a perspective view of a portion of a magneto-optic display element.

A pixel or post 40 of a magneto-optic display as shown by FIG. 2 is formed from a film layer 42 and a film layer support material 44. The film layer 42 is a relatively thin layer of material selected to exhibit magnetic domain characteristics and can be a ferrimagnetic garnet composition; for example, a bismuth substituted iron garnet. This film layer 42 can be prepared by liquid phase epitaxy (LPE) on the film support material 44. The film support material, which can be relatively thick, is selected to exhibit nonmagnetic and optically transparent characteristics such as those of a garnet substrate; for example, gadolinium gallium garnet (GGG).

The volume of magnetic material that forms the pixel 40 is bistable, i.e., magnetically reversible, where the easy anisotropy axis of the material is perpendicular to the perspective plane of the drawing.

A pair of row and column conductors 46 and 48 are positioned adjacent to the pixel 40, and can be positioned below the planar surface 50 of the pixel although this is not considered to be critical to the operation of the invention.

The row and column conductors 46 and 48 permit the application of a magnetic field to the pixel 40 by coincident current selection of the conductor line pair that includes the selected pixel.

IN FIG. 2, the film layer 42 is a relatively high-anisotropy region with an altered low-anisotropy region 52. This magnetic characteristic can be altered by ion implantation as described with respect to FIG. 1. With this low anisotropy, the magnetization direction can be reversed using only a small external field, resulting in the formation of a 180° domain wall 54 between opposite orientations of magnetization at the adjoining interface between the implanted region 52 and the remaining magnetic 42. The remainder of the pixel 40 is switched by propagating the wall 54 down through the thickness of the pixel, and then laterally. The field required to do this is small, because wall motion is limited only by demagnetizing, and wall coercivity effects.

The effects of the addition of a low-anisotropy region in a high-anisotropy region by ion-implantation were first observed in a magneto-optic display having a plurality of similar pixels or posts, such as pixel 40 as shown by FIG. 2, that was patterned as a 64×64 element array (15 mil square posts) and then implanted by quadrants according to the following:

| Quadrant #1: | No implant. |
| --- | --- |
| #2: | 200 keV, $3.2 \times 10^{14}$ B+/cm² plus 70 keV, $1.2 \times 10^{14}$ B+/cm² |
| #3: | 200 keV, $4.8 \times 10^{14}$ B+/cm² plus 70 keV, $1.8 \times 10^{14}$ B+/cm² |
| #4: | 200 keV, $1.6 \times 10^{14}$ B+/cm² plus 70 keV, $6 \times 10^{13}$ B+/cm² |

These implants produced a uniform, peak strain in the four quadrants of 0%, 0.4%, 0.6%, and 0.2% respectively based upon a method of predicting strain levels as presented by B. E. MacNeal and V. S. Speriosu; see J. Applied Physics, vol. 52, pp 3935–3940, June (1981). This film layer had a switching threshold of $h_s = 384$ Oe, a threshold width of $\Delta h_s = 66$ Oe, and a large number of early-switching elements.

Switching thresholds were measured in the four quadrants after implantation, and the non-implanted quadrant had about the same properties as before implantation: $h_s = 326$ Oe, and $\Delta h_s = 58$ Oe. In the fourth quadrant, with 0.2% strain, the threshold was drastically reduced, $h_s = 113$ Oe. The width was very narrow, $\Delta h_s = 5$ Oe, and there were very few early switching elements. In the second quadrant, with 0.4% strain, $h_s$ increased to 289 oe, and the width increased to $\Delta h_s = 26$ Oe. A further increase in $h_s$ to 374 Oe, and in $\Delta h_s$ to 27 Oe was observed in the third quadrant, with 0.6% strain. Additional work has shown that substantial reductions, in switching threshold, greater than 10:1, can be achieved in magneto-optic materials, as well as in more conventional magnetic bubble memory materials.

These results indicate that the addition of a low-anisotropy region in a high-anisotropy region, here by ion-implantation, does reduce the switching threshold significantly.

INDUSTRIAL APPLICABILITY

The addition of a low-anisotropy region in a high-anisotropy region of magneto-optic material reduces the external field necessary to alter or switch the magnetic characteristics of the material so that, when the material is used as a display element in a known magnetic-optic display, a more efficient and improved display results.

We claim:

1. A magneto-optic post element formed from a magnetic material that exhibits magnetic domain characteristics and supported by a nonmagnetic material, and coincident current select conductors acting upon the post element to selectively establish a preferred direction of magnetic orientation in the magnetic material, the implemented post element characterized by:

(a) said magnetic material having a high anisotropy characteristic;

(b) a first region in said magnetic material having a low anisotropy characteristic relative to the high anisotropy characteristic of said magnetic material, (c) an interface developed by the juxtaposition of said first region and said magnetic material so that said first region is exchange coupled with said magnetic material, and (d) an easy axis of magnetization in said magnetic material and in said first region so that the conductors act upon said implemented post element for the nucleation of a domain wall in said first region and the movement of the domain wall from said low anisotropy material of said first region, through said interface, and into said high anisotropy magnetic material where the propagation of the domain wall can be continued to affect a reversal of magnetic orientation in the magnetic material.

2. The magneto-optic post element of claim 1 in which said domain wall is an open domain wall.

3. The magneto-optic post element of claim 1 in which the interface has the physical ability to permit the passage of the domain wall.

* * * * *